United States Patent [19]

Sakai

[11] Patent Number: 4,770,971

[45] Date of Patent: Sep. 13, 1988

[54] PHOTOSENSITIVE AND PRESSURE-SENSITIVE RECORDING SHEET

[75] Inventor: Jun Sakai, Nagoya, Japan

[73] Assignee: Brother Kogyo Kabushiki Kaisha, Nagoya, Japan

[21] Appl. No.: 32,335

[22] Filed: Mar. 30, 1987

[30] Foreign Application Priority Data

Apr. 2, 1986 [JP] Japan .................................. 61-76167

[51] Int. Cl.⁴ ........................ G03C 1/72; G03C 1/68; G03C 1/495; G03C 1/40
[52] U.S. Cl. ................................. 430/138; 428/321.5; 430/202; 430/211; 430/235; 430/253
[58] Field of Search ............... 430/138, 202, 211, 235, 430/253; 428/320.6

[56] References Cited

U.S. PATENT DOCUMENTS

| | | | |
|---|---|---|---|
| 4,399,209 | 8/1963 | Sanders et al. | 430/138 |
| 4,416,966 | 11/1983 | Sanders et al. | 430/235 |
| 4,482,624 | 11/1984 | Arney et al. | 430/138 |
| 4,483,912 | 11/1984 | Sanders | 430/138 |
| 4,489,151 | 12/1984 | Sanders et al. | 430/138 |
| 4,501,809 | 2/1985 | Hiraishi et al. | 430/211 |
| 4,535,050 | 8/1985 | Adair et al. | 430/211 |
| 4,587,194 | 5/1986 | Adair et al. | 430/138 |
| 4,598,035 | 7/1986 | Usami et al. | 430/138 |
| 4,675,269 | 6/1987 | Saccocio et al. | 430/138 |
| 4,687,725 | 8/1987 | Wright et al. | 430/138 |

Primary Examiner—Mukund J. Shah
Attorney, Agent, or Firm—Kane, Dalsimer, Sullivan, Kurucz, Levy, Eisele and Richard

[57] ABSTRACT

A photosensitive and pressure-sensitive recording material, which comprises (A) a first layer coated on a sheet and containing microcapsules including a first reaction component for a color developing reaction and a component capable of altering the mechanical breaking strength of the microcapsule in response to exposure to light, (B) a second layer coated on the same or different sheet and containing a second reaction component for said color developing reaction brought about upon contact thereof with said first reaction component for building up an image corresponding to an exposed patterned light and (C) an ultraviolet ray absorbing agent contained in said first and/or the second layer.

3 Claims, 3 Drawing Sheets

PHOTOSENSITIVE AND PRESSURE-SENSITIVE RECORDING SHEET

FIELD OF THE INVENTION

The present invention relates to a photosensitive and pressure-sensitive recording material exhibiting better age stability.

DESCRIPTION OF THE PRIOR ART

Photosensitive paper of a type of reproducing the image or pattern of original by subjecting the paper to exposure to light passed through the original has been known. For example, there is known photosensitive paper having a coating layer containing a diazocompound on one face thereof.

Photosensitive paper of the type mentioned above exhibits inferior age stability. Thus, photosensitive paper of the above kind reproduces the image by the compound produced by a chemical reaction which is subject to decomposition by ultraviolet rays.

BRIEF SUMMARY OF THE INVENTION

The object of the invention is to solve the above problem and to propose a technical measure therefor as described below.

Thus, the gist of the present invention resides in a photosensitive and pressure-sensitive recording material comprising (A) a first layer coated on a sheet and containing microcapsules including a first reaction component for a color developing reaction and a component capable of altering the mechanical breaking strength of the microcapsule in response to exposure to light, (B) a second layer coated on the same or different sheet and containing a second reaction component for the color developing reaction brought about upon contact thereof with said first reaction component for building up an image corresponding to an exposed patterned light and (C) an ultraviolet ray absorbing agent contained in the first and/or the second layer.

DETAILED DESCRIPTION OF THE INVENTION

According to the present invention, the microcapsules in the coated layer will be subjected to an alteration of the mechanical breaking strength only in the portion where the microcapsules are exposed to light. Thus, the microcapsules exposed to light will be subjected to an increase or decrease in the breaking strength. By pressing the recording sheet according to the present invention on, such as, press rollers after the alteration of breaking strength of microcapsules has been effected, the weaker microcapsules on the recording sheet will be crushed, whereby the first reaction component enclosed in the microcapsules comes to react with the second reaction component to effect a color change by developing a preliminarily designed color so as to build up an image corresponding to the exposed patterned light on the recording sheet.

If the thus image-developed photosensitive and pressure-sensitive recording material is exposed to an ultraviolet ray, nevertheless the compound produced by said reaction will hardly come to decomposition, since the ulraviolet ray will be absorbed by the UV-absorbing agent contained in the recording material according to the present invention.

DESCRIPTION OF PREFERRED EMBODIMENTS

In the following, the present invention will be described by way of Examples. Here, it is to be emphasized that the present invention should not be restricted in any sense by these specific embodiments disclosed hereinafter, but may imply various modifications and alterations without departing from the gist and scope of the invention.

Figure 1:
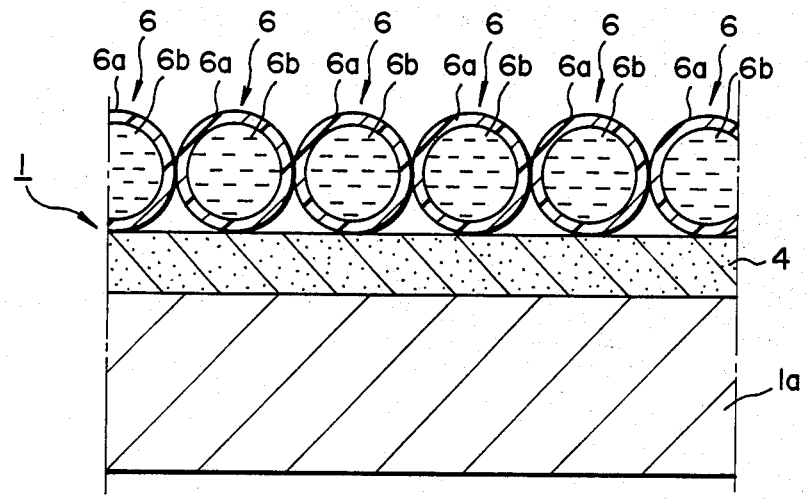
FIG. 1 is an explanatory illustration of the photosensitive and pressure-sensitive recording material according to a first embodiment of the invention, in sectional view.

The photosensitive and pressure-sensitive recording sheet 1 shown in FIG. 1 carries a layer of color developer 4 coated on one face of a sheet 1a of paper and a layer of microcapsules 6 coated over the color developer layer 4. The microcapsule 6 consists of a shell 6a and a liquid phase 6b enclosed in the shell 6a. The liquid phase 6b includes a light-hardenable substance capable of hardening in response to exposure to light, a dyestuff precursor capable of color developing by reacting with said color developer 4 and an ultraviolet ray absorbing agent.

As the dyestuff precursor, there may be employed triarylmethanes, bisphenylmethanes, xanthenes, thiazines, spiropyrans and so on as well as mixtures of them. The color developer serves for effecting a specific color development of said dyestuff precursor and there can be employed therefor, for example, clay minerals, organic asids, acidic polymers, metal salts, aromatic carboxylic acids and so on as well as mixtures of them.

For the light-hardenable substance, there may be employed photopolymerizable monomers, for example, acryloyl-containing compounds, such as, trimethylolpropane triacrylate and so on, which may be used in combination with a photo polymerization initiator. For the photo polymerization initiator, those which are sensitive to a light having a wave length not absorbed by the UV-absorbing agent which is explained afterwards. For example, benzophenone which exhibits an absorption band at a wave length around 250 nm, benzoyl alkylethers, such as, benzoyl isopropylether and so on, which have an absorption band around 330 nm, Michler's ketone which has an absorption band around 365 nm and 2,4-diethyl thioxanthone which has an absorption band around 383 nm exhibit ability for polymerizing said photo-polymerizable monomer and can be employed as the initiator under a suitable choice in such a manner, that the absorption band of the initiator will be discrepant with the ultraviolet ray absorbing agent explained below.

For the UV-absorbing agent, there may be employed materials capable of absorbing ultraviolet rays and converting them into heat energy, such as for example, compounds based on benzotriazole, based on oxalic acid anilide, based on salicylic acid, based on benzophenone, based on cyanoacrylate and those based on hindered amines. Among these, compounds based on benzotriazole are most preferred in respect of the UV-absorbing efficiency. Compounds based on benzotriazole to be employed according to the present invention are represented by the following structural formula

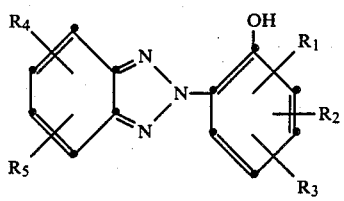

wherein $R_1$ –$R_5$ denote each hydrogen, a halogen, an alkyl, a cycloalkyl, an alkoxy, a carboalkoxy, or aryloxy or an aryl.

Among these, 2-(5-methyl-2-hydroxyphenyl) benzotriazole has an absorption band around 40 nm, 2-(3,5-di-tert-amyl-2-hydroxyphenyl) benzotriazole has an absorption band around 350 nm and 2-(3-tert-butyl-5-methyl-2-hydroxyphenyl)-5-chlorobenzotriazole has an absorption band around 360 nm. Thus, examples of combination of the photo polymerization initiator with the UV-absorbing agent according to the invention may include such pairs as benzophenone with 2-(5-methyl-2-hydroxyphenyl) benzotriazole, 2-4-diethyl-thioxanthone with 2-(3,5-di-tert-amyl-2-hydroxyphenyl) benzotriazole and so on.

The microcapsule 6 can be prepared in the form in which the photo-hardenable substance and the UV-absorbing agent are enclosed therein, by known techniques, such as, coacervation, interfacial polymerization and so on.

To a mass of so prepared microcapsules, a binder, filler substance, a viscosity regulator and so on are admixed to form a coating mixture, which is coated on a sheet 1a using, such as, coating roller, doctor etc., or by spraying and so on.

Figure 2:
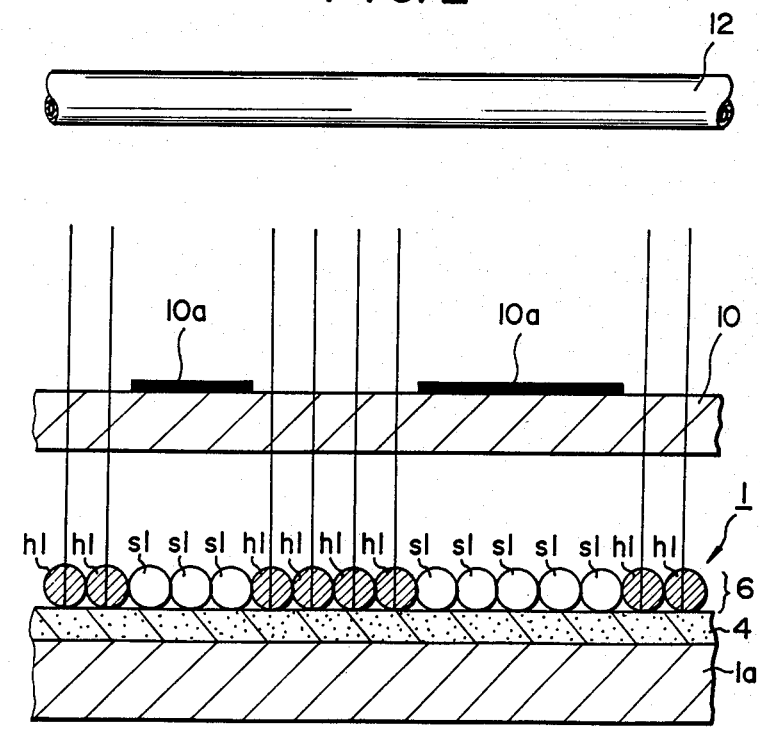
FIG. 2 is an explanatory illustration explaining the manner of realizing photo-recording by the recording material of FIG. 1.
Figure 3:
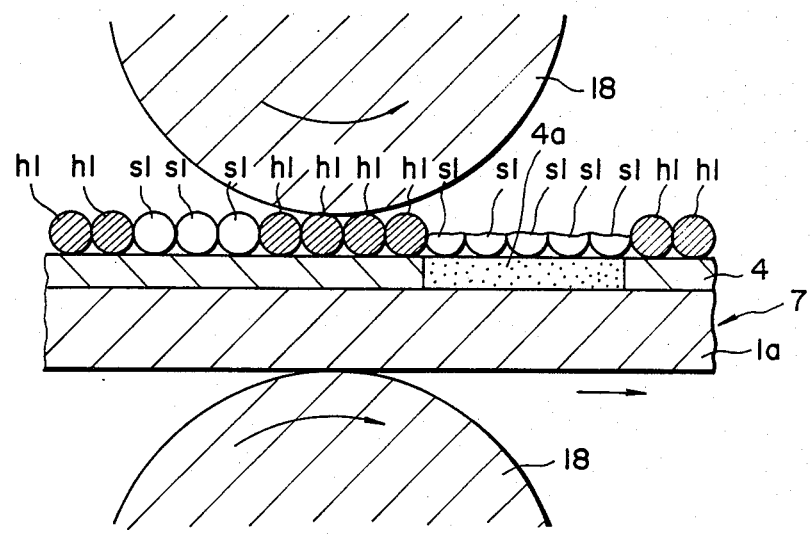
FIG. 3 explains the manner of squashing of the weaker microcapsules on the recording material of the invention by roller pressing.

The photosensitive and pressure-sensitive recording sheet 1 prepared as above is used for reproducing and recording the image or pattern of an original as illustrated in FIG. 2. The photosensitive and pressure-sensitive recording sheet 1 is exposed to an ultraviolet light from the light source 12 of an electric discharge tube through an original 10. The contents of the microcapsules on the recording sheet 1 will be hardened by the photo polymerization induced by irradiation of the ultraviolet ray passed through the original in the portions where there is no hindrance to the penetration of ultraviolet ray outside the light-impermeable regions 10a, whereby the mechanical breaking strength thereof is increased. In this Figure, the microcapsules s1 are not exposed to the ultraviolet ray and are held unhardened, whereas the microcapsules h1 are hardened by the exposure to the ultraviolet ray.

The recording sheet thus exposed and subjected to photo-hardening is then passed between a pair of press rollers 18 in order to squash the microcapsules remaining unhardened. The hardened microcapsules h1 are not crushed upon passing between the squeezing rollers 18 due to the high mechanical breaking strength achieved, whereas the microcapsules s1 which have not been subjected to photo-hardening are crushed and the liquid phase enclosed therein will leak out. Since the liquid phase inside the microcapsules includes the dyestuff precursor capable of effecting color development by reacting with the color developer in the color developer layer 4, the portions of the recording sheet 1 where the microcapsules are not subjected to exposure to the ultraviolet ray will develop a color, so that the image or pattern of the original 10 will be reproduced on the recording sheet 1. The ultraviolet ray absorbing agent included in the microcapsules 6 is retained in the color developed portions of the recording sheet, so that the stability of the developed image on standing for long time is very excellent.

Figure 4:
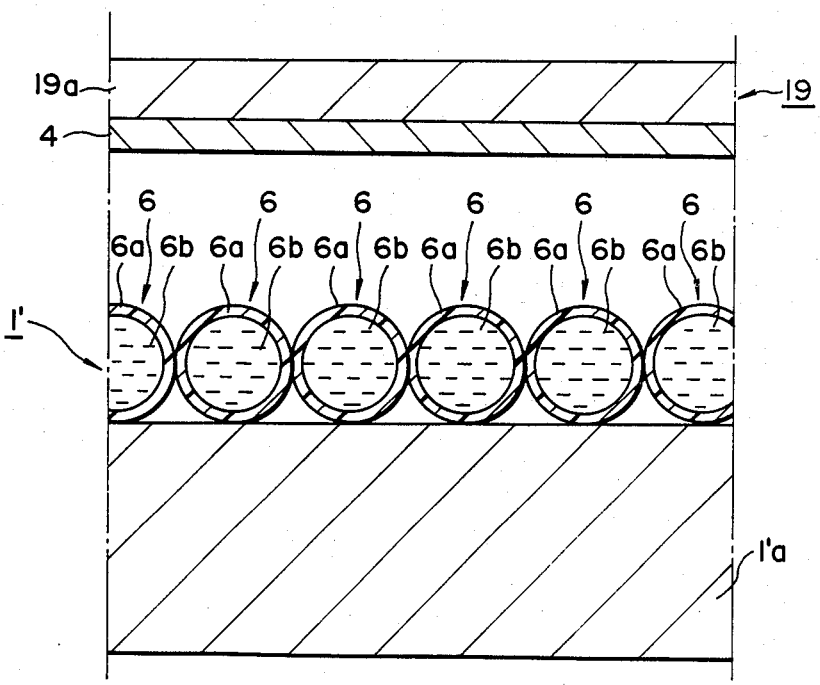
FIG. 4 shows an another embodiment of the recording material of the invention, in which the recording material consists of a color developing sheet and a microcapsule-sheet to be put together for pressing between rollers for color development.
Figure 5:
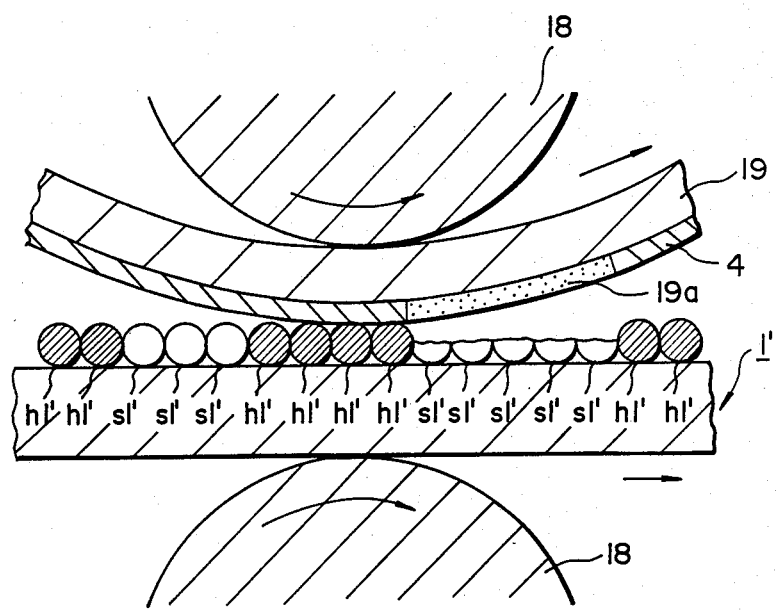
FIG. 5 explains the manner of color development by pressing the photosensitive and pressure-sensitive recording material of FIG. 4.

While the above embodiment employs a lamination of color developing layer and the microcapsule-layer on one single sheet, it is possible to provide the color developing layer and the microcapsule-layer on either one of different sheets respectively. Thus, as shown in FIG. 4 in an enlarged sectional view, the photosensitive and pressure-sensitive recording material according to the invention may consist of two separate sheets, namely, a developer sheet 19 coated with a layer 4 containing the color developer and an exposure sheet 1' coated with a layer containing the microcapsules 6. The photorecording is realized in this embodiment by exposing first the exposure sheet 1' to an ultraviolet light as shown in FIG. 2, putting the so exposed and photopolymerized exposure sheet 1' together with the developer sheet 19 and then passing the laminated two sheets through a pair of squeezing rollers 18 as shown in FIG. 5, in order to cause the unexposed microcapsules to crush so as to reproduce the image of the original 10 on the developer sheet 19.

Although in the above embodiments, the microcapsules contain the dyestuff precursor, the photo-hardenable substance and the UV-absorbing agent, it is also possible that two kinds of microcapsules are employed in which one contains the dyestuff precursor and the photo-hardenable substance and the other contains the UV-absorbing agent. In this case, the light-absorption bands for the UV-absorbing agent and for the photo polymerization initiator have not to be discrepant with each other, but may fall under the same wave length.

While in the above embodiments, the color development is realized by the reaction of the dyestuff precursor with the color developer, it is also possible, that the first component contained in the liquid phase of the microcapsules is a decolorizing agent, such as, desensitizer acting to keep the color developer to be isolated from the dyestuff precursor, a bleaching agent exhibiting a redox-activity or so on, and the second component is a dyestuff subject to decolorizing by said first component. In this case, the image of the original is reproduced by a change in hue, lightness or saturation caused by the decolorization.

While, furthermore, in the embodiments described above, the photohardenable substance is employed for increasing the mechanical breaking strength of the microcapsules, it is possible to use a photo-decomposing substance to lower the mechanical breaking strength of the microcapsules prepared initially in a harder consistency, by exposure to light. In this case, the microcapsules existing in the portions irradiated by the light will be crushed upon passing through the squeezing rollers due to the lower strength, whereupon the color development is achieved in a similar manner. Examples of such substances may include 3-oxyimino-2-butanone methacrylate, poly-4'-alkylacylo-phenones and so on.

Similar effects may be achieved by constituting the shell itself of the microcapsule from a photo-decomposing substance, instead of using the technical measure of enclosing the photo-polymerizable or -decomposing substance in the microcapsule.

By the photosensitive and pressure-sensitive recording material according to the present invention which is constructed as above, it is possible to obtain photo-recording of images with superior age stability.

What is claimed is:

1. A photosensitive and pressure-sensitive recording material comprising:
    (a) a first layer coated on a flat substrate and containing microcapsules including a first reaction component for a color developing reaction, photopolymerization initiator and a component capable of altering the mechanical breaking strength of the microcapsule in response to exposure to light; and
    (b) a second layer coated on the same or a different flat substrate and containing a second reaction component for said color developing reaction brought about upon contact thereof with said first reaction component for producing an image corresponding to an exposed patterned light;
    one of said layers containing an ultraviolet absorbing agent which receives ulraviolet rays to convert them into heat;
    whereby the image corresponding to said patterned light is recorded on said material by subjecting the first and second layers to a mechanical pressing force to cause the microcapsules which are kept or rendered weakened after exposure to the patterned light to be crushed so as to effect contact of the first and second reaction components.

2. A recording material as claimed in claim 1, wherein said ultraviolet ray absorbing agent is incorporated in the microcapsule.

3. A recording material as claimed in claim 1, wherein said ultraviolet ray absorbing agent is incorporated in the layer containing said second reaction component.

* * * * *